(12) United States Patent
Yang et al.

(10) Patent No.: US 7,517,780 B2
(45) Date of Patent: Apr. 14, 2009

(54) METHOD FOR ELIMINATING POLYCIDE VOIDS THROUGH NITROGEN IMPLANTATION

(75) Inventors: Ling-Wuu Yang, Hsinchu (TW); Kuang-Chao Chen, Hsinchu County (TW); Tuung Luoh, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/044,212

(22) Filed: Jan. 28, 2005

(65) Prior Publication Data

US 2006/0172519 A1    Aug. 3, 2006

(51) Int. Cl.
*H01L 21/3205*    (2006.01)
*H01L 21/4763*    (2006.01)
*H01L 21/44*    (2006.01)

(52) U.S. Cl. ............................. 438/592; 257/E21.199; 438/683

(58) Field of Classification Search ................. 438/592, 438/682, 683, 166, 151; 257/E21.199, E21.316, 257/E21.433, E21.584
See application file for complete search history.

(56) References Cited

U.S. PATENT DOCUMENTS

| | | | | |
|---|---|---|---|---|
| 5,940,725 | A * | 8/1999 | Hunter et al. | 438/592 |
| 6,452,273 | B1 * | 9/2002 | Kim et al. | 257/754 |
| 6,521,527 | B1 * | 2/2003 | Kuroi et al. | 438/652 |
| 7,009,264 | B1 * | 3/2006 | Schuegraf et al. | 257/408 |

\* cited by examiner

*Primary Examiner*—Walter L Lindsay, Jr.
(74) *Attorney, Agent, or Firm*—Jianq Chyun IP Office

(57) ABSTRACT

A method of manufacturing a semiconductor device includes providing a first layer over a wafer substrate, providing a polysilicon layer over the first layer, implanting nitrogen ions into the polysilicon layer, forming a polycide layer over the polysilicon layer, and forming source and drain regions.

9 Claims, 2 Drawing Sheets

METHOD FOR ELIMINATING POLYCIDE VOIDS THROUGH NITROGEN IMPLANTATION

FIELD OF THE INVENTION

The present invention relates generally to a method for fabricating a semiconductor device, and more particularly, to a method for eliminating formation of voids in polycide through ion implantation.

BACKGROUND OF THE INVENTION

In modern integrated circuits ("ICs"), reduction of feature sizes is an important consideration in reducing the manufacturing cost. A likewise important consideration is the speed that stored data may be read. The speed of a memory IC depends, among others, on the speed of word lines. In the semiconductor industry's continued effort to reduce feature sizes of ICs, the width of word lines is also reduced, which increases the resistance of the word lines. As is known, higher resistance on a word line reduces its speed, which, in turn, decreases the speed of the memory IC.

In order to fabricate high performance ICs, low resistivity on the word line is therefore critical. In conventional metal-oxide semiconductor ("MOS") ICs, polysilicon is often used in place of aluminum (Al) as the gate material. However, a drawback of polysilicon compared to aluminum is its significantly higher resistivity, which may be reduced by doping. Nevertheless, even when doped at a high concentration, the resistance of doped polysilicon remains high. One approach to reduce polysilicon resistivity is to deposit a layer of metal over the polysilicon, or the gate area of a CMOS transistor after the CMOS transistor has been formed. Only the portion of the metal layer deposited over the polysilicon layer will react with the polysilicon to form silicide. The process for forming suicides is therefore "self-aligned" and is referred to as the salicide technology. Through the formation of a metal silicide layer over a polysilicon gate, the resulting "polycide" has a significantly lower resistivity. Common metals used for the formation of polycide structures include, but are not limited to, titanium, tungsten, molybdenum, and cobalt.

Polycide formation is typically followed by a high temperature anneal process to further reduce the electrical resistance of the polycide layer. However, the thermal annealing may lead to the diffusion of silicon atoms from the polysilicon layer and into the overlying gate polycide structure. Such a diffusion creates voids at the polycide/polysilicon interface and may adversely affect the operations of the ICs.

SUMMARY OF THE INVENTION

In accordance with the invention, there is provided a method of manufacturing a semiconductor device that includes providing a first layer over a wafer substrate, providing a polysilicon layer over the first layer, implanting nitrogen ions into the polysilicon layer, forming a polycide layer over the polysilicon layer, and forming source and drain regions.

Also in accordance with the invention, there is provided a method of manufacturing a semiconductor device that includes defining a wafer substrate, providing a first layer over the wafer substrate, forming a second layer over the first layer, implanting nitrogen ions into the second layer, forming a polycide layer over the second layer, providing a layer of photoresist over the polycide layer, patterning and defining the photoresist layer, etching the polycide layer and the second layer to form at least one gate electrode having at least one sidewall, removing the photoresist layer, implanting an impurity into the wafer substrate to define source and drain regions, and forming at least one spacer along the sidewall of the at least one gate electrode.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the invention and together with the description, serve to explain the principles of the invention.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

Figure 1:
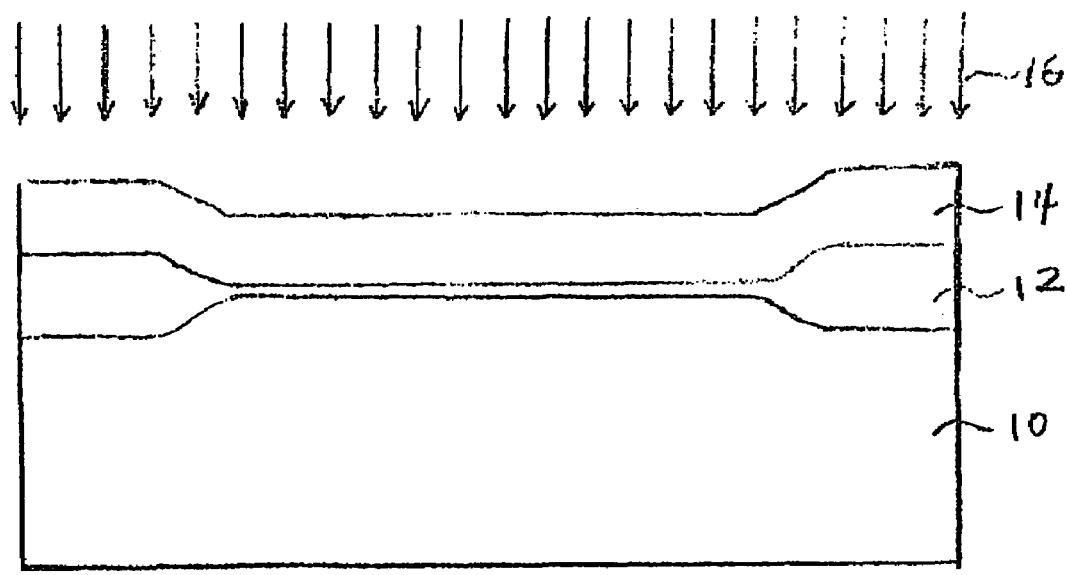
FIGS. 1-4 are cross-sectional views of a manufacturing process consistent with one embodiment of the present invention.

The present invention provides a method for fabricating a semiconductor device with reduced or absence of voids in a polysilicon layer. FIGS. 1-4 are cross-sectional views of a manufacturing process consistent with one embodiment of the present invention. Referring to FIG. 1, the method of the invention starts with defining a wafer substrate 10 and providing a first layer 12 over wafer substrate 10. First layer 12 includes field isolation structures and may be comprised of silicon oxides and acts as an insulator. A second layer 14 is formed over first layer 12 and may be comprised of polysilicon. After second layer 14 is formed, nitrogen ions 16 are implanted into second layer 14 to impart desirable conductivity characteristics. N2 energy 15~50 Kev, dose 1E14~5E14. Ar, Si, Ge would also be used as dopant. N2 is implanted into the polysilicon not far away from the top surface. After thermal annealing in the following process, Polysilicon will be amorphous due to N2 retard grain growth.

The doped nitrogen ions will retard grain growth of the polysilicon in second layer 14, and consequently the polysilicon grain size will be reduced compared to conventional polysilicon layers. Reduced polysilicon grain size greatly reduces, and even prevents, diffusion of silicon atoms during the subsequent polycide processes, thereby reducing or eliminating voids in the polysilicon layers. An optional cleaning step may follow to remove any native oxide that may have been formed over second layer 14. Diluted HF solution is often used to remove the native oxide layer. This also ensures good adherence of second layer 14 to the overlying layer.

Figure 2:
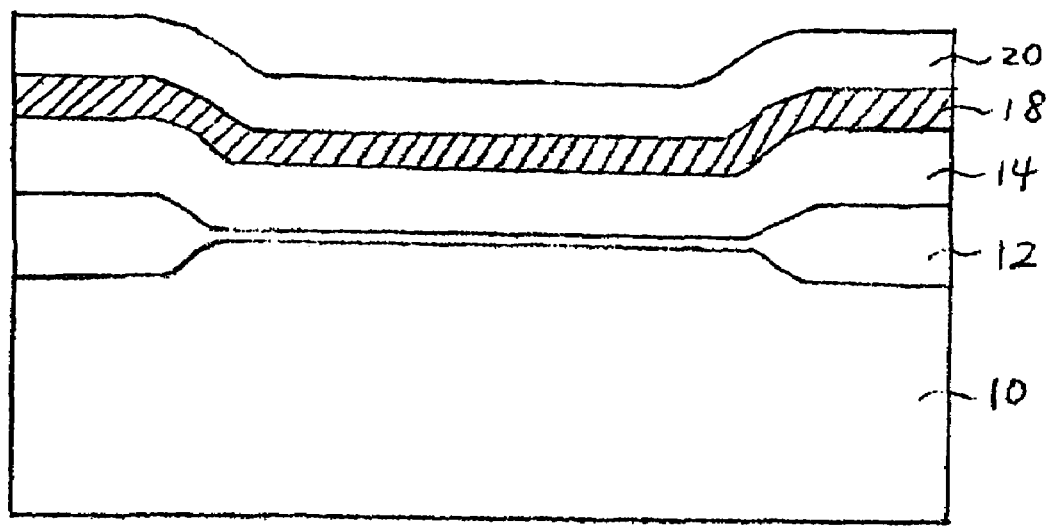
Figure 3:
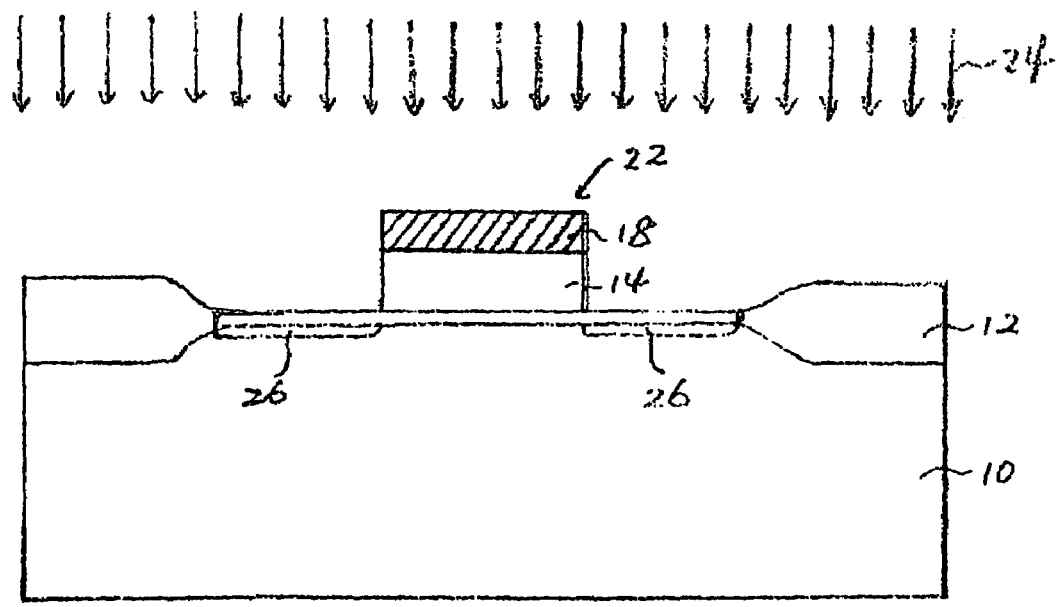

Referring to FIG. 2, a refractory metal, such as titanium and tungsten, is deposited over second layer 14. An anneal step follows to form a thermally stable polycide or silicide layer 18. A photoresist ("PR") layer 20 is then provided over the silicide layer 18. Referring to FIG. 3, PR 20 is patterned and defined using a conventional photolithographic method. An etching step is then performed to form a gate electrode 22 comprising polysilicon layer 14 and silicide layer 18. PR 20 is stripped and removed, and a second ion implantation of impurities 24 defines source and drain regions 26 of the devices. As is known to one skilled in the art, the impurities to be used depends on the type of MOS transistor to be formed by the manufacturing process. Polysilicon gate layer 14 and polycide layer 18 serve as a mask during the second ion implantation. Subsequent to the second ion implantation, source/drain oxidation step may be performed to further drive, or diffuse, the dopants into the substrate.

Figure 4:
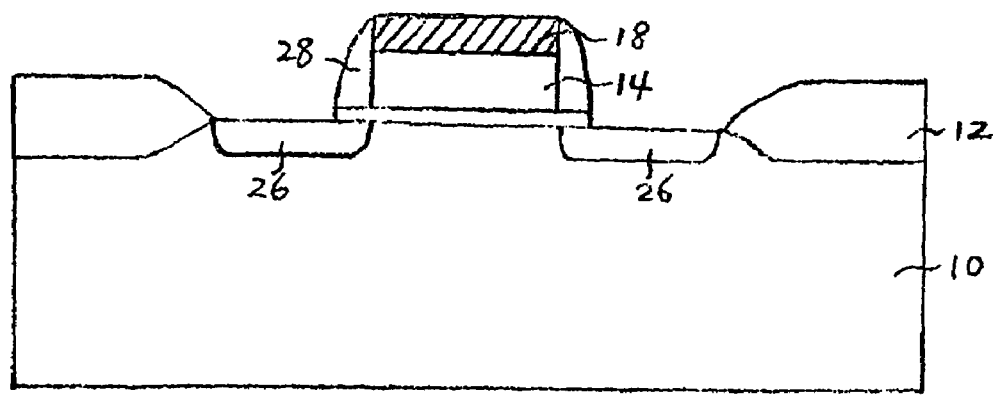

Referring to FIG. 4, spacers 28 are formed along the sidewalls of gate electrode 22. This can be achieved by depositing a layer of oxide (not shown) across the surface of the wafer 10 and etching back using a dry etch process, or through thermal oxidation. The oxide layer may be comprised of silicon dioxide. During the etching process, gate oxide 12 may be damaged, particularly at or near corners of gate electrode 22. A re-oxidation step may be performed to repair the damaged gate oxide 12 and also strengthen the integrity of gate oxide 12.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of manufacturing a semiconductor device, comprising:
   providing a first layer over a wafer substrate;
   providing a polysilicon layer over the first layer;
   implanting nitrogen ions into the polysilicon layer; at a location near a top surface of the polysilicon layer to retard the growth of the grain size at a subsequent annealing step, wherein a dose of the nitrogen ions is 1E14~5E14;
   forming a polycide layer over the polysilicon layer, wherein the step of forming a polycide layer comprises depositing a metal layer over the polysilicon layer and annealing the polysilicon layer; and
   forming source and drain regions.

2. The method of claim 1, wherein the first layer comprises a layer of silicon oxide.

3. The method of claim 1, further comprising removing native oxide formed over the polysilicon layer.

4. The method of claim 3, wherein the stop of removing native oxide comprises cleaning with a diluted HF solution.

5. A method of manufacturing a semiconductor, device, comprising:
   defining a wafer substrate;
   providing a first layer over the wafer substrate;
   forming a second layer over the first layer;
   implanting nitrogen ions into the second layer at a location near a top surface of the polysilicon layer to retard the growth of the grain size at a subsequent annealing step, wherein a dose of the nitrogen ions is 1E14~5E14;
   forming a polycide layer over the second layer;
   providing a layer of photoresist over the polycide layer;
   patterning and defining the photoresist layer;
   etching the polycide layer and the second layer to form at least one gate electrode having at least one sidewall;
   removing the photoresist layer; implanting an impurity into the wafer substrate to define source and drain regions;
   forming at least one spacer along the sidewall of the at least one gate electrode; and
   a reoxidation step, afterforming the spacer, to repair the gate oxide and strengthen the integrity of the gate oxide.

6. The method of claim 5, further comprising a cleaning step to remove native oxide formed over the second layer.

7. The method of claim 5, wherein the second layer comprises polysilicon.

8. The method of claim 5, further comprising a source/drain oxidation step to drive the impurity further into the substrate.

9. The method of claim 5, where the step of forming a polycide layer comprises depositing a metal layer over the second layer and annealing the second layer.

* * * * *